US012751269B2

(12) United States Patent
Lee et al.

(10) Patent No.: US 12,751,269 B2
(45) Date of Patent: Sep. 29, 2026

(54) CONNECTING STRUCTURE COMPRISING ISOLATION BETWEEN CONNECTING VIAS AND METHOD FOR FORMING THE SAME

(71) Applicant: TAIWAN SEMICONDUCTOR MANUFACTURING COMPANY LTD., Hsinchu (TW)

(72) Inventors: Chia Chen Lee, Taipei City (TW); Chia-Tien Wu, Taichung City (TW); Shih-Wei Peng, Hsinchu City (TW); Kuan Yu Chen, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 465 days.

(21) Appl. No.: 18/152,784

(22) Filed: Jan. 11, 2023

(65) Prior Publication Data

US 2024/0088019 A1 Mar. 14, 2024

Related U.S. Application Data

(60) Provisional application No. 63/374,909, filed on Sep. 8, 2022.

(51) Int. Cl.

| | |
|---|---|
| ***H01L 23/522*** | (2006.01) |
| ***H01L 21/768*** | (2006.01) |
| ***H01L 23/528*** | (2006.01) |
| ***H10W 20/00*** | (2026.01) |
| ***H10W 20/42*** | (2026.01) |
| ***H10W 20/43*** | (2026.01) |

(52) U.S. Cl.

CPC ......... *H10W 20/42* (2026.01); *H10W 20/033* (2026.01); *H10W 20/056* (2026.01); *H10W 20/076* (2026.01); *H10W 20/081* (2026.01); *H10W 20/43* (2026.01)

(58) Field of Classification Search

None

See application file for complete search history.

(56) References Cited

U.S. PATENT DOCUMENTS 10,020,223 B1 * 7/2018 Anderson ......... H01L 23/53238
2014/0131883 A1 * 5/2014 Huang .............. H01L 23/53238 438/643

* cited by examiner

*Primary Examiner* — Daniel Whalen

(74) *Attorney, Agent, or Firm* — WPAT LAW; Anthony King

(57) ABSTRACT

A connecting structure includes a first dielectric layer, a first connecting via in the first dielectric layer, a second connecting via in the first dielectric layer, and an isolation between the first connecting via and the second connecting via. The isolation separates the first and second connecting vias from each other. The first connecting via, the isolation and the second connecting via are line symmetrical about a central line perpendicular to a top surface of the first dielectric layer.

20 Claims, 12 Drawing Sheets

CONNECTING STRUCTURE COMPRISING ISOLATION BETWEEN CONNECTING VIAS AND METHOD FOR FORMING THE SAME

PRIORITY CLAIM AND CROSS-REFERENCE

This application claims the benefit of prior-filed provisional application No. 63/374,909, filed on Sep. 8, 2022.

BACKGROUND

The semiconductor integrated circuit (IC) industry has experienced rapid growth. Technological advances in IC materials and design have produced continuous improvements over generations of ICs. Each generation has produced smaller and more complex circuits than the previous generation. However, such advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices of smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 9A and 9B are schematic views of a connecting structure at a fabrication stage constructed according to aspects of one or more embodiments of the present disclosure, wherein FIG. 9B is a cross-sectional view taken along a line II-IT of FIG. 9A.

DETAILED DESCRIPTION

Figure 1:
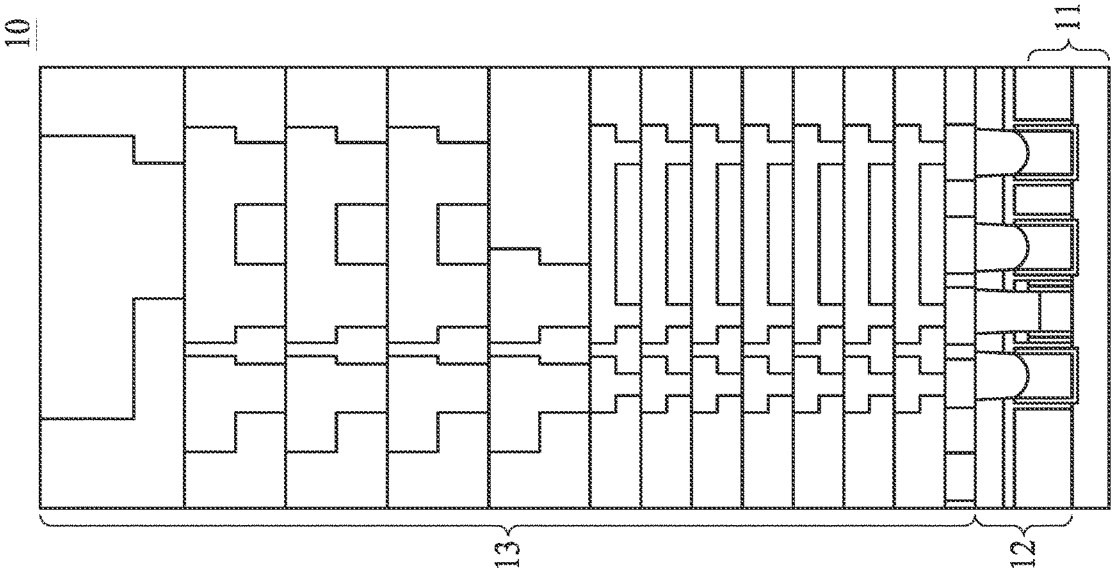
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as “first,” “second” and “third” describe various elements, components, regions, layers and/or sections, but these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context.

An IC manufacturing process flow can typically be divided into three categories: front-end-of-line (FEOL), middle-end-of-line (MEOL) and back-end-of-line (BEOL) processes. FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of semiconductor structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL processes. Accordingly, operation of the IC devices can be enabled.

As mentioned above, the scaling down processes have increased the complexity of processing and manufacturing of ICs. For example, resistivity is increased and routing congestion issues arise. In some comparative approaches, such challenges are found not only in the FEOL process, the MEOL process and the BEOL process, but also in the packaging process.

The present disclosure therefore provides a connecting structure and a method for forming the same. In some embodiments, a volume of the connecting structure is less than one half a volume of a connection structure in the comparative approaches. Further, the method for forming the connecting structure can be integrated with the FEOL, MEOL and BEOL processes, and even in the packaging process. Therefore, the provided connecting structure and the method for forming the same provide improved compatibility and flexibility in semiconductor manufacturing.

In some embodiments, the method can be used to form a MEOL connecting structure. In such embodiments, the connecting structure can be a MEOL metallization such as a contact or a plug. In other embodiments, the method can be used to form a BEOL connecting structure. In such embodiments, the connecting structure can be a BEOL metallization such as one or more connecting vias.

FIG. 1 is a fragmentary cross-sectional view of a semiconductor structure 10. As mentioned above, an IC manufacturing process flow can typically be divided into three categories: the FEOL, the MEOL and the BEOL processes. In some embodiments, devices formed by the FEOL processes can be referred to as FEOL devices 11, semiconductor structures formed by the MEOL processes can be referred to as MEOL connecting structures 12, and MLI structures formed by the BEOL processes can be referred to as BEOL connecting structures 13. Accordingly, the semiconductor structure 10 can include the FEOL devices 11, the MEOL connecting structures 12 and the BEOL connecting structures 13.

Figure 2:
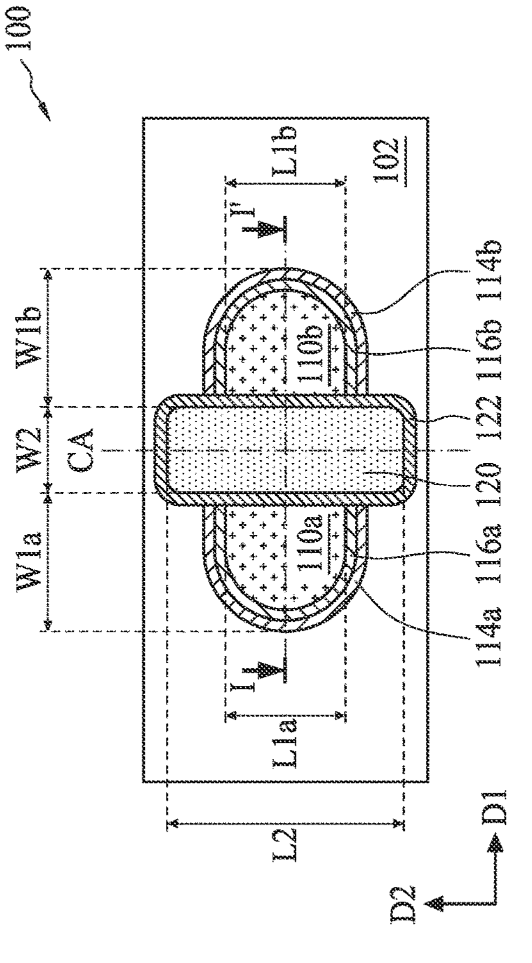
FIG. 2 is a plan view of a connecting structure according to various aspects of the present disclosure.
Figure 3:
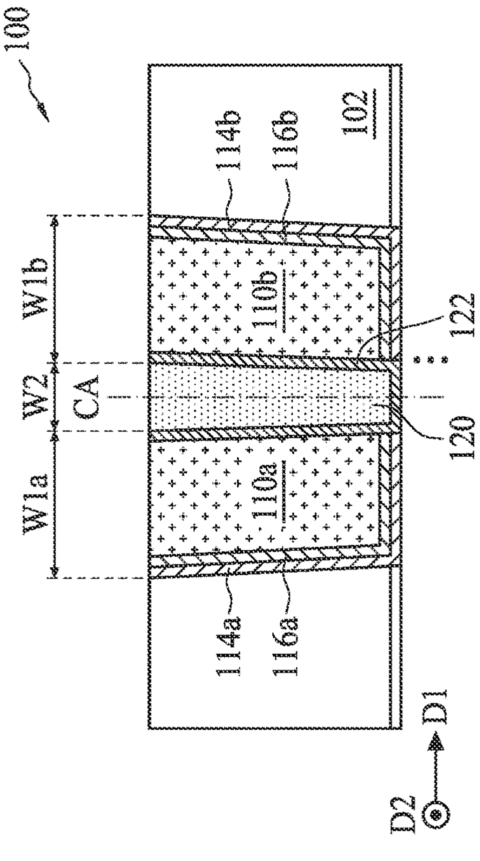
FIG. 3 is a cross-sectional view of the connecting structure taken along a line I-I' of FIG. 2.

Please refer to FIGS. 2 and 3, wherein FIG. 2 is a plan view of a connecting structure 100, and FIG. 3 is a cross-sectional view taken along line I-F of FIG. 2. As shown in FIGS. 2 and 3, the connecting structure 100 includes a layer 102. In some embodiments, the layer 102 may include a dielectric layer. In such embodiments, the dielectric layer 102 includes silicon oxide, silicon nitride, silicon oxynitride, silicon oxycarbide, silicon oxycarbon nitride, metal oxide, metal nitride, metal carbide or combinations thereof. In other embodiments, the layer 102 may include a semiconductive layer. In such embodiments, the semiconductive layer 102 may include silicon. Alternatively or additionally, the semiconductive layer 102 may include another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the semiconductive layer 102 may include one or more group III-V materials, one or more group II-IV materials, or combinations thereof. In some implementations, the semiconductive layer 102 is a multi-layered structure such as a semiconductor-on-insulator structure. For example but not limited thereto, the semiconductive layer 102 may be a silicon-on-insulator (all) structure, a silicon germanium-on-insulator (SGOI) structure, or a germanium-on-insulator (GOI) structure.

The connecting structure 100 includes a connecting via 110*a* disposed in the layer 102 and a connecting via 110*b* disposed in the layer 102. In some embodiments, the connecting via 110*a* and the connecting via 110*b* together are referred to as a dual via. The connecting via 110*a* and the connecting via 110*b* include a same material. In some embodiments, the connecting vias 110*a* and 110*b* include copper (Cu), ruthenium (Ru), tungsten (W), aluminum (Al), cobalt (Co), molybdenum (Mo), iridium (Jr), rhodium (Rh), carbon (C), nickel aluminide (NiAl), copper aluminide (CuAl), scandium aluminide (ScAl), ruthenium aluminide (RuAl) or a combination thereof.

The connecting structure 100 includes an isolation 120 disposed between the connecting via 110*a* and the connecting via 110*b* in the layer 102. In other words, the isolation 120 is inserted into the dual via. As shown in FIGS. 2 and 3, the connecting vias 110*a* and 110*b* may extend in a first direction D1, while the isolation 120 extends in a second direction D2 different from the first direction D1. In some embodiments, the second direction D2 is perpendicular to the first direction D1, but the disclosure is not limited thereto. The isolation 120 separates the connecting via 110*a* and the connecting via 110*b* from each other. In other words, the isolation 120 provides physical and electrical isolation between the connecting via 110*a* and the connecting via 110*b*. In some embodiments, the isolation 120 includes dielectric materials such as, silicon oxide, silicon nitride, silicon oxynitride, silicon oxycarbide, silicon oxycarbon nitride, metal oxide, metal nitride, metal carbide, or a combination thereof.

In some embodiments, the connecting via 110*a*, the isolation 120 and the connecting via 110*b* are line symmetrical about a central line CA. In other embodiments, the connecting via 110*a* and the connecting via 110*b* may include different widths. In still other embodiments, the connecting via 110*a*, the isolation 120 and the connecting via 110*b* may include different widths.

In some embodiments, a width W2 of the isolation 120 is less than a width W1*a* of the connecting via 110*a* measured in the first direction D1, and the second width W2 is less than a width W1*b* of the connecting via 110*b* measured in the first direction D1. In some embodiments, the width W1*a* of the connecting via 110*a* and the width W1*b* of the connecting via 110*b* are equal. In such embodiments, the connecting via 110*a*, the isolation 120 and the connecting via 110*b* are line symmetrical about the central axis CA perpendicular to a top surface of the layer 102. However, in some alternative embodiments, the width W1*a* of the connecting via 110*a* and the width W1*b* of the connecting via 110*b* may be different. In some embodiments, the width W2 of the isolation 120 may be between approximately 10 nanometers and approximately 300 nanometers, but the disclosure is not limited thereto. The width W2 of the isolation 120 may be adjusted depending on different processes (e.g., the FEOL process, the MEOL process, the BEOL process or a packaging process).

In some embodiments, a length L2 of the isolation 120 is greater than a length L1*a* of the connecting via 110*a* measured in the second direction D2, and a length L1*b* of the connecting via 110*b* measured in the second direction D2. Accordingly, the isolation 120 entirely separates the connecting vias 110*a* and 110*b*. The length L1*a* of the connecting via and the length L1*b* of the connecting via 110*b* are equal. In some embodiments, the lengths L1*a* and L1*b* of the connecting vias 110*a* and 110*b* are between approximately 10 nanometers and approximately 800 nanometers, but the disclosure is not limited thereto. The lengths L1*a* and L1*b* of the connecting vias 110*a* and 110*b* may be adjusted depending on different processes (e.g., the FEOL process, the MEOL process, the BEOL process or the packaging process). In some embodiments, the length L2 of the isolation 120 is between approximately 10 nanometers and approximately 1000 nanometers, but the disclosure is not limited thereto. The length L2 of the isolation 120 may be adjusted depending on different processes (e.g., the FEOL process, the MEOL process, the BEOL process or the packaging process).

In some embodiments, a height of the isolation 120, a height of the connecting via 110*a* and a height of the connecting via 110*b* are equal. In some embodiments, a top surface of the isolation 120, a top surface of the connecting via 110*a* and a top surface of the connecting via 110*b* are aligned with each other. Further, the top surface of the isolation 120 and the top surfaces of the connecting vias 110*a* and 110*b* are aligned with the top surface of the layer 102. In some embodiments, a bottom surface of the isolation 120, a bottom surface of the connecting via 110*a* and a bottom surface of the connecting via 110*b* are aligned with each other, but the disclosure is not limited thereto. For example, in other embodiments, the bottom surface of the isolation 120 may be lower than the bottom surfaces of the connecting vias 110*a* and 110*b*, as shown in FIG. 3.

Still referring to FIGS. 2 and 3, in some embodiments, the connecting structure 100 further includes a barrier layer 114*a* disposed between the layer 102 and the connecting via 110*a*, and a barrier layer 114*b* disposed between the layer 102 and the connecting via 110*b*. As shown in FIG. 2, each of the barrier layers 114*a* and 114*b* is U-shaped from a top view. As shown in FIG. 3, each of the barrier layers 114*a* and 114*b* is an L-shaped barrier layer. The barrier layer 114*a* and the barrier layer 114*b* have a same thickness and a same material. In some embodiments, the L-shaped barrier layer 114*a* and the L-shaped barrier layer 114*b* are line symmetrical about a central axis CA. In other embodiments, the L-shaped barrier layer 114*a* and the L-shaped barrier layer 114*b* can have different configuration according to the different width W1*a* and width W1*b*. The barrier layer 114*a* and the barrier layer 114*b* have a same thickness and a same material. In some embodiments, the thicknesses of the barrier layers 114*a* and 114*b* are between approximately 10 angstroms and approximately 100 angstroms, but the disclosure is not limited thereto. In some embodiments, the barrier layers 114*a* and 114*b* include tantalum (Ta), tantalum nitride (TaN), titanium (Ti), cobalt, ruthenium, niobium (Nb), tungsten, aluminum, molybdenum, iridium or combinations thereof. In some embodiments, the barrier layers 114*a* and 114*b* can be absent according to the material of the connecting vias 110*a* and 110*b*, but the disclosure is not limited thereto.

In some embodiments, the connecting structure 100 may further include a liner 116*a* disposed between the connecting via 110*a* and the barrier layer 114*a*, and a liner 116*b* disposed between the connecting via 110*b* and the barrier layer 114*b*. As shown in FIG. 2, each of the liners 116*a* and 116*b* is U-shaped from a top view. As shown in FIG. 3 each of the liners 116*a* and 116*b* is an L-shaped liner. The liner 116*a* and the liner 116*b* have a same thickness and a same material. In some embodiments, the L-shaped liner 116*a* and the L-shaped liner 116*b* are line symmetrical about the central axis CA. In other embodiments, the L-shaped liner 116*a* and the L-shaped liner 116*b* can have different configuration according to different width W1*a* and width W1*b*. In some embodiments, the liner 116*a* and the liner 116*b* may have a same thickness and a same material. In some embodiments, the thicknesses of the liners 116*a* and 116*b* are between approximately 10 angstroms and approximately 100 angstroms, but the disclosure is not limited thereto. In some embodiments, the liners 116*a* and 116*b* include tantalum, tantalum nitride, titanium, cobalt, ruthenium, niobium, tungsten, aluminum, molybdenum, iridium or combinations thereof, but the disclosure is not limited thereto. In some embodiments, the liners 116*a* and 116*b* can be absent according to the material of the connecting vias 110*a* and 110*b*. In some embodiments, the liners 116*a* and 116*b* include materials different from those of the barrier layers 114*a* and 114*b*, but the disclosure is not limited thereto.

In some embodiments, the connecting structure 100 further includes another liner 122 between the isolation 120 and the connecting via 110*a*, and between the isolation 120 and the connecting via 110*b*. As shown in FIG. 2, the liner 122 is O-shaped from a top view. As shown in FIG. 3, the liner 122 is a U-shaped dielectric liner. The liner 122 may include silicon, silicon oxide, silicon nitride, silicon carbide, metal oxide, metal nitride, metal oxycarbide, copper, ruthenium, tungsten, titanium, aluminum, cobalt, selenium (Se), tantalum, or a combination thereof. In some embodiments, the liner 122 may be absent, but the disclosure is not limited thereto.

Figure 4:
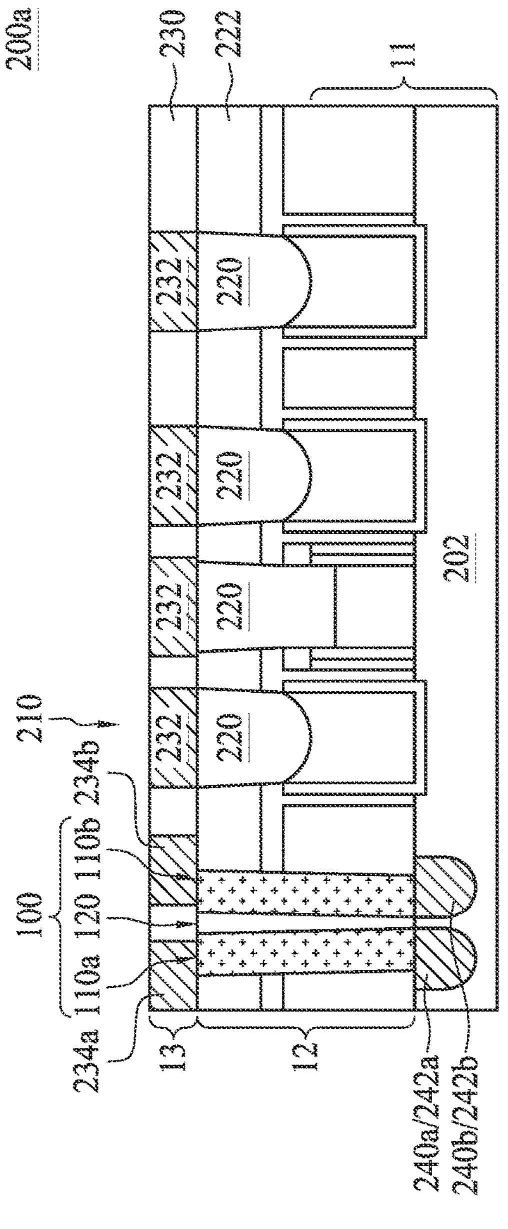
FIG. 4 is a schematic drawing illustrating a semiconductor structure including a connecting structure according to various aspects of the present disclosure.
Figure 5:
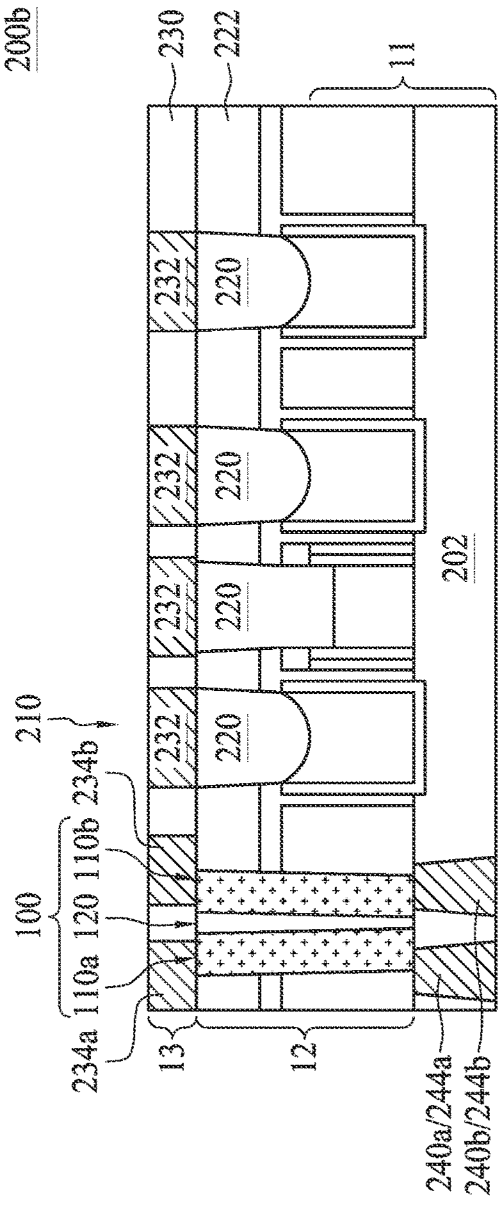
FIG. 5 is a schematic drawing illustrating a semiconductor structure including a connecting structure according to various aspects of the present disclosure.

FIGS. 4 and 5 are schematic drawings respectively illustrating a semiconductor structure including a connecting structure according to various aspects of the present disclosure. It should be noted that same elements in FIGS. 2 to 5 are indicated by same numerals, and can include a same material. In some embodiments, a connecting structure 100 as shown in FIGS. 2 and 3 can be provided. In some embodiments, the semiconductor structure 200*a* and the semiconductor structure 200*b* respectively can be a MEOL connecting structure 12 as shown in FIG. 1, but the disclosure is not limited thereto. As shown in FIGS. 4 and 5, each of the semiconductor structures 200*a* and 200*b* may include a substrate (wafer) 202. In some embodiments, the substrate 202 includes silicon. Alternatively or additionally, the substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or a combination thereof. In some implementations, the substrate 202 includes one or more group III-V materials, one or more group II-IV materials, or a combination thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 202 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or combinations thereof. N-type doped regions (for example, n-type wells) include n-type dopants, such as phosphorus, arsenic, another n-type dopant, or combinations thereof. In some implementations, the substrate 202 includes doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping processes can be performed to form the various doped regions.

Isolations (not shown) can be formed over and/or in the substrate 202 to electrically isolate various regions, such as various device regions, of the semiconductor structure. For example, the isolations can define and electrically isolate active device regions and/or passive device regions from each other. The isolations can include silicon oxide, silicon nitride, silicon oxynitride, another suitable isolation material, or combinations thereof. Isolation features can include different structures, such as shallow trench isolation (STI) structures, deep trench isolation (DTI) structures, and/or local oxidation of silicon (LOCOS) structures.

Various devices can be formed over the substrate 202. For example, a field effect transistor (FET) device 210 including a gate structure, a source structure and a drain structure can be disposed over the substrate 202, though not shown. The source/drain structures may refer to a source or a drain, individually or collectively dependent upon the context. In some embodiments, the gate structure can be formed over a fin structure. In some embodiments, the gate structure can include a metal gate structure. In some embodiments, the metal gate structure includes a gate dielectric layer and a gate electrode. The gate dielectric layer can be disposed over the substrate 202, and the gate electrode is disposed on the gate dielectric layer. The gate dielectric layer includes a dielectric material, such as silicon oxide, high-k dielectric material, another suitable dielectric material, or a combination thereof. High-k dielectric material generally refers to dielectric materials having a high dielectric constant, for example, a dielectric constant greater than that of silicon oxide ($k \approx 3.9$). Exemplary high-k dielectric materials include hafnium, aluminum, zirconium, lanthanum, tantalum, titanium, yttrium, oxygen, nitrogen, another suitable constituent, and combinations thereof. In some embodiments, the gate dielectric layer includes a multilayer structure, such as an interfacial layer (IL) including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or a combination thereof.

The gate electrode includes an electrically-conductive material. In some implementations, the gate electrode includes multiple layers, such as one or more work function metal layers and gap-filling metal layers. The work function metal layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, and combinations thereof. N-type work function materials include Ti, Al, Ag, Mn, Zr, TiAl, TiAlC, TaC, TaCN, TaSiN, TaAl, TaAlC, TiAlN, other n-type work function materials, and combinations thereof. The gap-filling metal layer can include a suitable conductive material, such as Al, W, and/or Cu.

The gate structure can further include spacers (not shown), which are disposed adjacent to (for example, along sidewalls of) the gate structure. The spacers can be formed by any suitable process and include a dielectric material. The dielectric material can include silicon, oxygen, carbon, nitrogen, another suitable material, or a combination thereof (for example, silicon oxide, silicon nitride, silicon oxynitride, or silicon carbide). In some embodiments, the spacers can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structure.

Implantation, diffusion, and/or annealing processes can be performed to form lightly-doped source/drain (LDD) features and/or heavily-doped source/drain (HDD) features in the substrate 202 before and/or after the forming of the spacers.

In some embodiments, the source structure and the drain structure of the device can include epitaxial structures (not shown). Accordingly, the gate structure, the epitaxial source/drain structure and a channel region defined between the epitaxial source/drain structures form a device such as a transistor. In some embodiments, the epitaxial source/drain structures can surround source/drain regions of a fin structure. In some embodiments, the epitaxial source/drain structures can replace portions of the fin structure. The epitaxial source/drain structures are doped with n-type dopants and/or p-type dopants. In some embodiments, where the transistor is configured as an n-type device (for example, having an n-channel), the epitaxial source/drain structure can include silicon-containing epitaxial layers or silicon-carbon-containing epitaxial layers doped with phosphorous, another n-type dopant, or a combination thereof (for example, Si:P epitaxial layers or Si:C:P epitaxial layers). In alternative embodiments, where the transistor is configured as a p-type device (for example, having a p-channel), the epitaxial source/drain structures can include silicon-and-germanium-containing epitaxial layers doped with boron, another p-type dopant, or a combination thereof (for example, Si:Ge:B epitaxial layers). In some embodiments, the epitaxial source/drain structures include materials and/or dopants that achieve desired tensile stress and/or compressive stress in the channel region.

It should be noted that the connecting via 110*a*, the isolation 120 and the connecting via 110*b* are separated from the device 210.

In some embodiments, each of the semiconductor structures 200*a* and 200*b* includes a plurality of connecting vias 220. The connecting vias 220 are coupled to the device 210 for providing electrical connection. In some embodiments, the semiconductor structures 200*a* and 200*b* include an isolation 222 between the connecting vias 220 and separating the connecting vias 220 from each other. In some embodiments, the isolation 222 may be referred to as a portion of the layer 102 of the connecting structure 100. In such embodiments, the connecting structure 100 is disposed over the semiconductor substrate 202. As mentioned above, the connecting vias 110*a* and 110*b* together are referred to as a dual via, and the connecting via 220 is referred to as a single via. It should be noted that in some embodiments, a width of the connecting structure 100 is substantially equal to a width of the connecting via 220. In some embodiments, each of the widths W1*a*, W1*b* of the dual via (i.e., the connecting vias 110*a* and 110*b*) is less than the width of the single via (i.e., the connecting via 220).

In some embodiments, a BEOL connecting structure 13 is disposed over the MOEL structure 12. Although only a portion of the BEOL connecting structure 13 is shown in FIGS. 4 and 5, those skilled in the art should realize other portions of the BEOL connecting structure 13 according to FIG. 1. As shown in FIGS. 4 and 5, the BEOL connecting structure 13 may include a dielectric layer 230 disposed over the isolation 222, and a plurality of metallization lines 232 disposed in the dielectric layer 230. In some embodiments, the metallization lines 232, which are closest to the MEOL connecting structure 12, are referred to as a first metallization layer M1 of the BEOL connecting structure 13. The dielectric layer 230 may include silicon oxide, silicon nitride, silicon oxycarbide, silicon oxycarbon nitride, oxygen-doped carbide (ODC), nitrogen-doped carbide (NDC), tetraethoxysilane (TEOS), poly(ethylene oxide) (PEO)-silane (PEOS), or a combination thereof, but the disclosure is not limited thereto. In some embodiments, the metallization lines 232 include copper, ruthenium, tungsten, aluminum, cobalt, molybdenum, iridium, rhodium, carbon, nickel aluminide, copper aluminide, scandium aluminide, ruthenium aluminide or combinations thereof.

A metallization line 234*a* and a metallization line 234*b* are also disposed in the dielectric layer 230. Further, the metallization lines 234*a* and 234*b* are separated from the metallization lines 232. The metallization line 234*a* is coupled to the connecting via 110*a*, and the metallization line 234*b* is coupled to the connecting via 110*b*. Further, the metallization line 234*a* is separated from the metallization line 234*b*, as shown in FIGS. 4 and 5. In some embodiments, a distance between the metallization line 234*a* and the metallization line 234*b* is greater than a width of the isolation 212. The metallization line 234*a* provides an electrical connection between the connecting via 110*a* and other metallization lines in the BEOL connecting structure 13, and the metallization line 234*b* provides an electrical connection between the connecting via 110*b* and other metallization lines in the BEOL connecting structure 13. For example, the connecting via 110*a* may be electrically connected to a power source while the connecting via 110*b* may be grounded.

In some embodiments, conductive features 240*a* and 240*b* may be formed in the semiconductor substrate 202. In some embodiments, the conductive features may be doped regions 242*a* and 242*b*, as shown in FIG. 4. In some embodiments, the conductive features are metallization structures 244*a* and 244*b*, such as through silicon vias (TSVs), as shown in FIG. 5. The conductive feature 240*a* is coupled to the connecting via 110*a*, and the conductive feature 240*b* is coupled to the connecting via 110*b*. Further, the conductive features 240*a* and 240*b* are separated from the device 210, as shown in FIGS. 4 and 5. In some embodiments, a distance between the conductive structure 240*a* and the conductive structure 240*b* is greater than a width of the isolation 120.

Still referring to FIG. 4, in some embodiments, the connecting vias 110*a* and 110*b* therefore provide different electrical paths between the BEOL connecting structures 13 and the FEOL device 11. For example, the connecting via 110*a* may be electrically connected to a power source while the connecting via 110*b* may be grounded. Referring to FIG. 5, in other embodiments, the connecting vias 110*a* and 110*b* provide different electrical paths between a front side and a back side of the semiconductor structure 200*b*.

Figure 6:
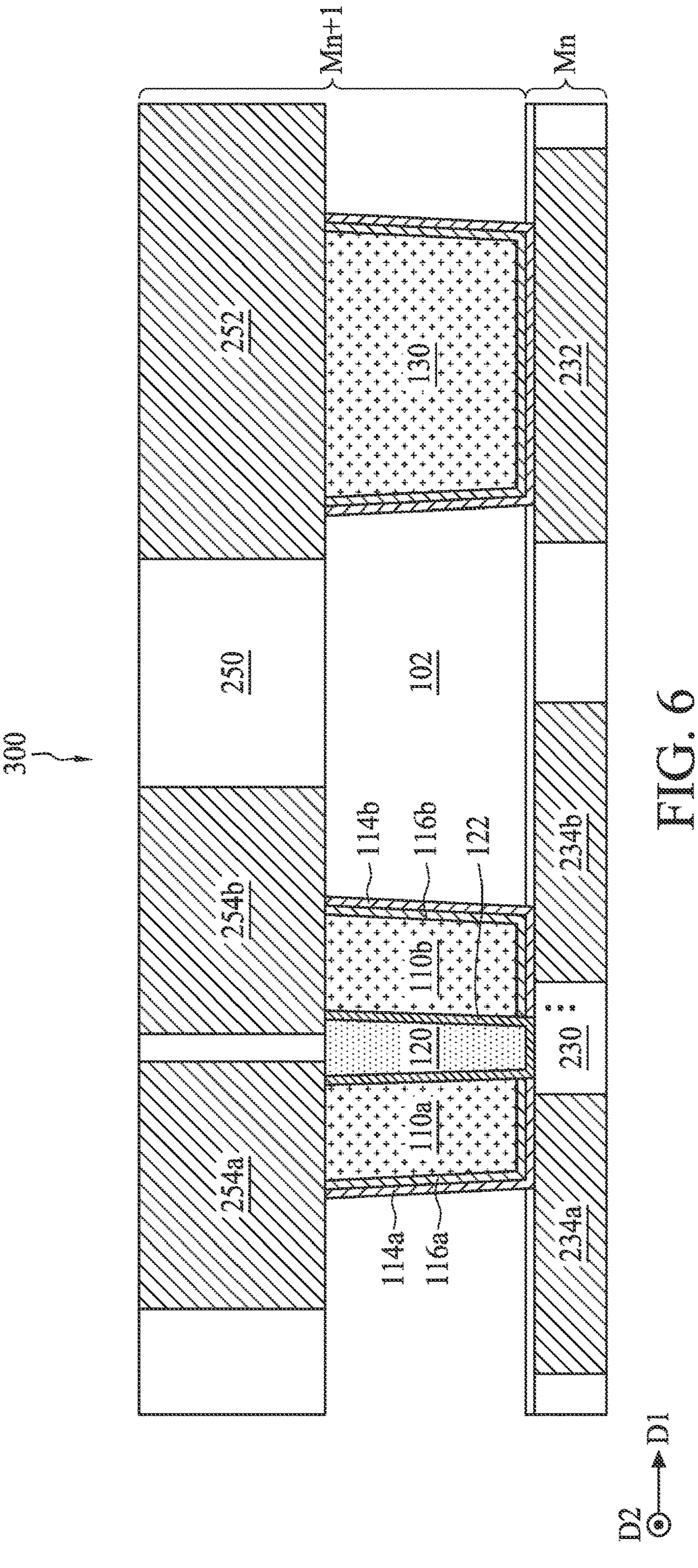
FIG. 6 is a schematic drawing illustrating a semiconductor structure including a connecting structure according to various aspects of the present disclosure.

Please refer to FIG. 6, which is a schematic drawing illustrating a semiconductor structure including a connecting structure 300 according to various aspects of the present disclosure. It should be noted that same elements in FIGS. 2 to 6 are indicated by same numerals, and can include a same material. In some embodiments, the connecting structure 100 as shown in FIGS. 2 and 3 can be provided. In some embodiments, the semiconductor structure 300 can be a BEOL connecting structure 13 as shown in FIG. 1, but the disclosure is not limited thereto.

As mentioned above, the BEOL connecting structure 13 may include a plurality of multilayer interconnect structures. For example, as shown in FIG. 6, an Mn layer including a dielectric layer and a plurality of metallization lines disposed in the dielectric layer may be provided. The Mn layer can be any layer of the BEOL connecting structure 13. For example, the Mn layer may be a first layer M1, which is the closest layer to the MEOL connecting structure 12, of the BEOL connecting structure 13, but the disclosure is not limited thereto. In such embodiments, the Mn layer may include the metallization lines 232 (as shown in FIGS. 4 and 5), the metallization line 234*a* and the metallization line 234*b* disposed in the dielectric layer 230. As mentioned above, the metallization lines 234*a* and 234*b* are separated from the metallization lines 232. The connecting structure 100 is disposed over the Mn layer. Further, the connecting structure 100 may be referred to as a portion of an Mn+1 layer, such as a layer M2. In such embodiments, the layer 102 is a dielectric layer including materials similar to those of the dielectric layer 230, but the disclosure is not limited thereto. As mentioned above, the connecting via 110*a* is coupled to the metallization line 234*a*, and the connecting via 110*b* is coupled to the metallization line 234*b*. In some embodiments, a plurality of connecting vias 130 may be formed in the dielectric layer 102. The connecting via 130 is coupled to one of the metallization lines 232. In such embodiments, the connecting vias 110*a* and 110 together are referred to as a dual via, and the connecting via 130 is referred to as a single via. In some embodiments, a width of the connecting via 130 may be substantially equal to the width of the connecting structure 100. In such embodiments, the widths W1*a*, W1*b* of the dual via (i.e., the connecting via 110*a* and the connecting via 110*b*) are both less than the width of the single via (i.e., the connecting via 130).

Still referring to FIG. 6, in some embodiments, another dielectric layer 250 is disposed over the dielectric layer 102, and a plurality of metallization lines 252, 254*a* and 254*b* are disposed in the dielectric layer 250. In some embodiments, the dielectric layer 250 and the metallization lines 252, 254*a* and 254*b* are referred to as a portion of the Mn+1 layer. In such embodiments, the dielectric layer 250, the metallization lines 252, 254*a* and 254*b* in the dielectric layer 250, the dielectric layer 102 and the connecting structure 100 are referred to as an Mn+1 layer.

The metallization line 252 is coupled to the connecting via 130 and thus electrically connected to the metallization line 232 in the Mn layer. The metallization lines 254*a* and 254*b* are separated from the metallization line 232. Further, the metallization line 254*a* is separated from the metallization line 254*b*. In some embodiments, a distance between the metallization line 254*a* and the metallization line 254*b* is greater than a width of the isolation 120, but the disclosure is not limited thereto. In some alternative embodiments, the distance between the metallization line 254*a* and the metallization line 254*b* is less than the width of the isolation 120, as shown in FIG. 6. The distance between the metallization line 254*a* and the metallization line 254*b* can be adjusted as long as it is ensured that the metallization line 254*a* is physically and electrically separated from the metallization line 254*b*.

As shown in FIG. 6, the metallization line 254*a* is coupled to the connecting via 110*a* and thus electrically connected to metallization line 234*a* in the Mn layer. The metallization line 254*b* is coupled to the connecting via 110*b* and thus electrically connected to the metallization line 234*b* of the Mn layer. Accordingly, different electrical paths can be provided by the connecting structure 100.

Figure 7:
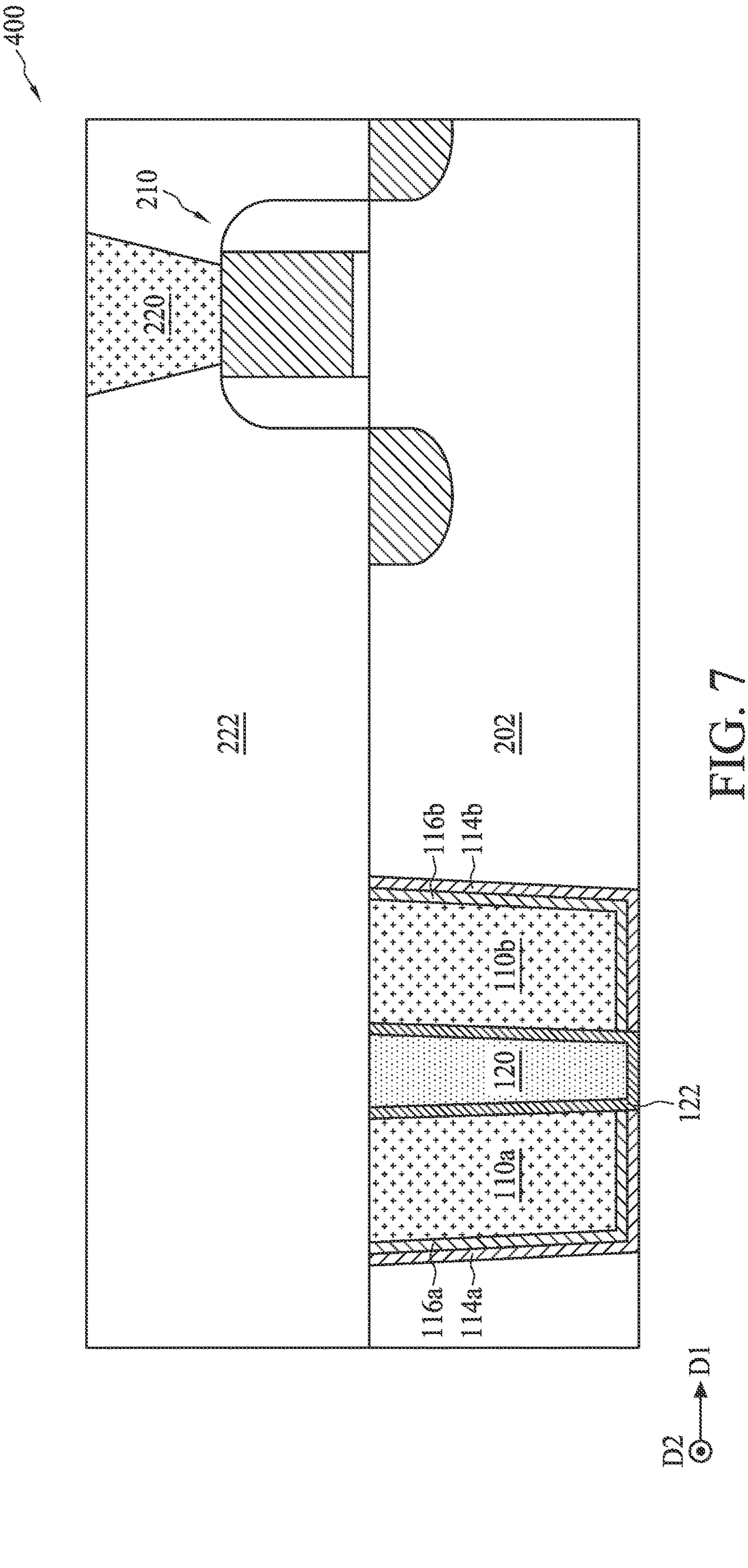
FIG. 7 is a schematic drawing illustrating a semiconductor structure including a connecting structure according to various aspects of the present disclosure.

Please refer to FIG. 7, which is a schematic drawing illustrating a semiconductor structure 400 including a connecting structure according to various aspects of the present disclosure. It should be noted that same elements in FIGS. 2 to 7 are indicated by same numerals, and can include a same material. In some embodiments, a connecting structure 100 as shown in FIGS. 2 and 3 can be provided. In some embodiments, the connecting structure 100 serves as through silicon vias (TSVs) in the semiconductor structure 400.

In some embodiments, the connecting structure 100 is disposed in a semiconductor substrate 202, thus the semiconductor substrate 202 can be referred to as a layer 102. In some embodiments, other TSVs may be formed in the semiconductor substrate 202, but the connecting vias 110*a* and 110*b* and the isolation 120 are separated from those TSVs. Further, a width of the TSV may be greater than the width W1*a* of the connecting via 110*a*, and greater than the width W1*b* of the connecting via 110*b*. In some embodiments, the connecting via 110*a* and the connecting via 110*b* are coupled to different MEOL connecting structures 12 (not shown). Further, the connecting vias 110*a* and 110*b* can be electrically connected to different electrical paths in the BEOL connecting structure 13 (not shown in FIG. 7). The connecting vias 110*a* and 110*b* may further be coupled to different terminals (not shown) on the back side of the semiconductor substrate 202. Accordingly, the connecting structure 100 provides different electrical paths from the front side of the semiconductor substrate 202 to the back side of the semiconductor substrate 400.

As shown in FIGS. 2 to 7, the provided connecting structure 100 has two connecting vias 110*a* and 110*b* providing different electrical paths. Further, an area occupied by each via of the dual via (i.e., the connecting vias 110*a* and 110*b*) is substantially one-half of an area occupied by the single via (i.e., the connecting via 220 in FIGS. 4 and 5, and the connecting via 130 in FIG. 6). In other words, an area needed for the dual via is reduced. Further, the connecting structure 100 can be integrated into the FEOL process, the MEOL process, the BEOL process, and even the packaging process, thereby improving process flexibility.

Figure 8:
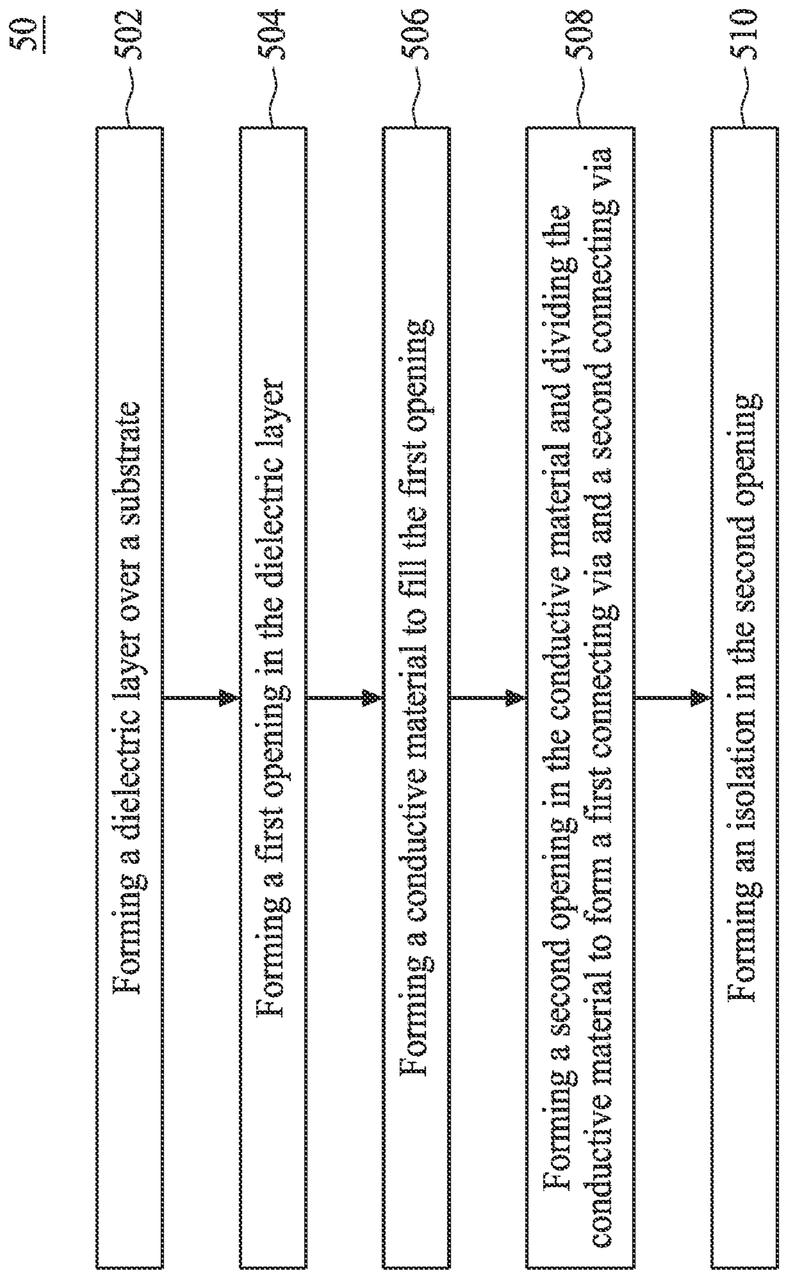
FIG. 8 is a flowchart representing a method for forming a semiconductor structure according to aspects of the present disclosure.

FIG. 8 is a flowchart representing a method for forming a connecting structure 50 according to aspects of the present disclosure. In some embodiments, the method 50 can be used in a method for forming a semiconductor structure including a MEOL connecting structure or a BEOL connecting structure as mentioned above. Further, the method 50 can be used in a method for forming a FEOL device or a package. In some embodiments, the method for forming the connecting structure 50 includes a number of operations (502, 504, 506, 508 and 510). The method for forming the connecting structure 50 will be further described according to one or more embodiments. It should be noted that the operations of the method 50 may be rearranged or otherwise modified within the scope of the various aspects. It should further be noted that additional processes may be provided before, during, and after the method 50, and that some other processes may be only briefly described herein.

Figure 9A:
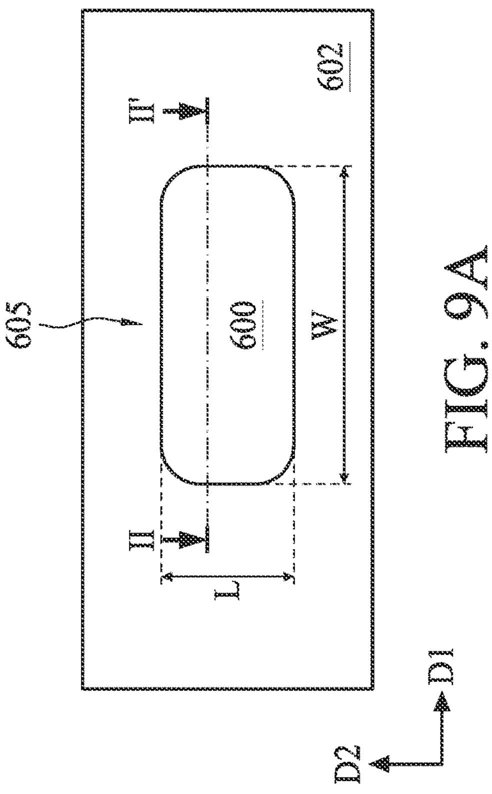
Figure 9B:
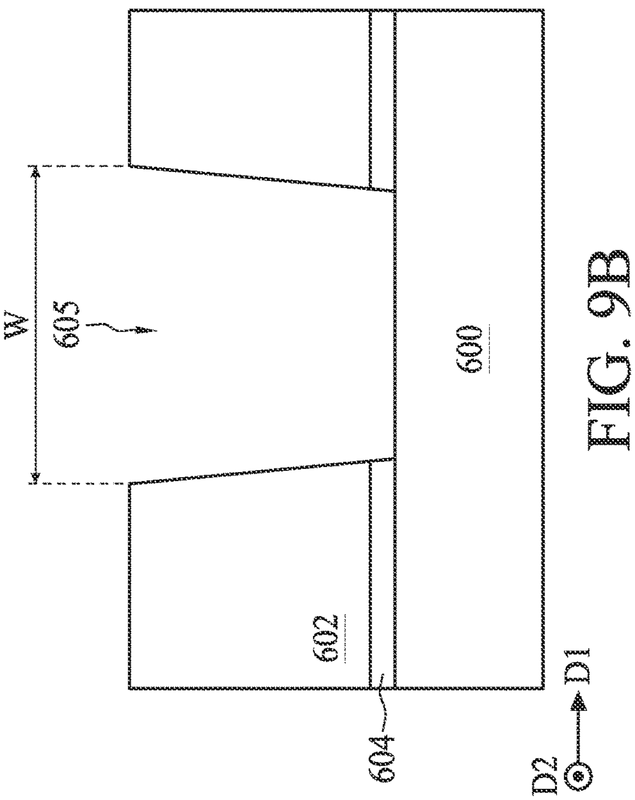

FIGS. 9A and 9B are schematic drawings illustrating a stage in the method 50 according to aspects of one or more embodiments of the present disclosure. Referring to FIGS. 9A and 9B, in operation 502, a dielectric layer 602 is formed over a substrate 600. In some embodiments, the substrate 600 is a semiconductor substrate, such as the semiconductor substrate shown in FIGS. 4 and 5. In such embodiments, the dielectric layer 602 may be referred to as an interlayer dielectric (ILD) in a MEOL connecting structure 12. In other embodiments, the substrate 600 includes a semiconductor substrate and a multi-layered structure disposed thereon, as shown in FIG. 6. In such embodiments, the dielectric layer 602 may be referred to as an inter-metal dielectric (IMD) in a BEOL connecting structure 13. Materials used to form the dielectric layer 602 may be similar to those described above; therefore, repeated descriptions of such details are omitted for brevity.

In some embodiments, an etch stop layer (ESL) 604 may be disposed between the dielectric layer 602 and the substrate 600. In some alternative embodiments, the etch stop layer 604 may be absent and thus the dielectric layer 602 is in contact with the substrate 600. The etch stop layer 604 may be a single layer or a multiple layer. In some embodiments, the etch stop layer 604 includes silicon carbon nitride, silicon oxide, silicon nitride, aluminum oxynitride, metal oxide, ruthenium, tungsten, titanium, aluminum, cobalt, or a combination thereof.

Still referring to FIGS. 9A and 9B, in operation 504, an opening 605 is formed in the dielectric layer 602. In some embodiments, the forming of the opening 605 may include multiple steps. For example, an etch operation is performed on the dielectric layer 602, thereby forming the opening 605 in the dielectric layer 602. In such embodiments, the etch stop layer 604 is exposed through a bottom of the opening 605, and the dielectric layer 602 is exposed through sidewalls of the opening 605. The etch stop layer 604 exposed through the bottom of the opening 605 is then removed to expose a portion of the substrate 600. In some embodiments, conductive features such as doped regions or conductive lines, as shown in FIGS. 4 and 5, are exposed through the bottom of the opening 605. In other embodiments, metallization lines, as shown in FIG. 6, are exposed through the bottom of the opening 605.

As shown in FIG. 9A, the opening 605 has a width W measured in a direction D1, and a length L measured in a direction D2. In some embodiments, the width W of the opening 605 can be between approximately 10 nanometers and approximately 1,000 nanometers, depending on different process approaches. In some embodiments, the length L of the opening 605 can be between approximately 10 nanometers and approximately 800 nanometers, depending on different process approaches.

Figure 10A:
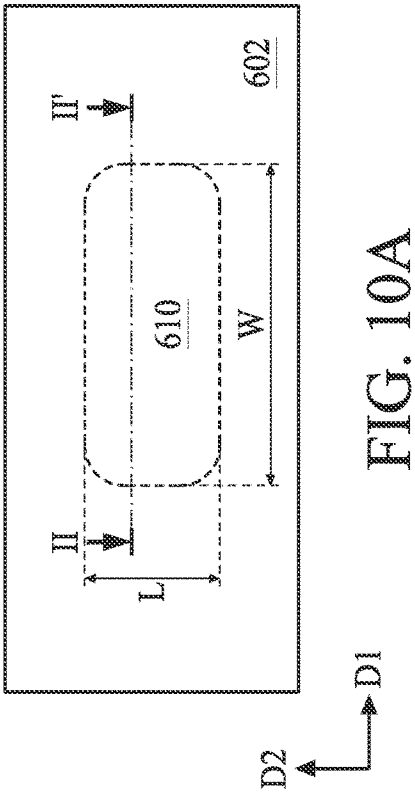
FIGS. 10A and 10B are schematic views of the connecting structure at a fabrication stage subsequent to that of FIGS. 9A and 9B.
Figure 10B:
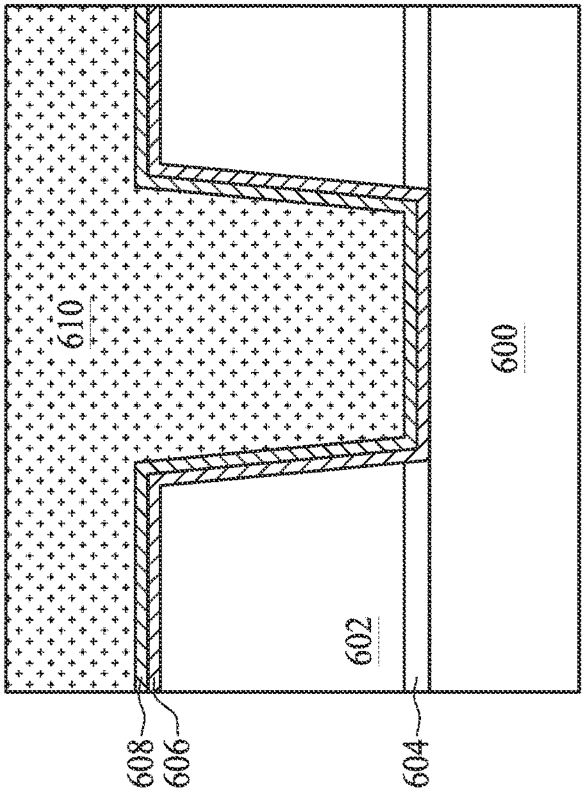

Referring to FIGS. 10A and 10B, in operation 506, a conductive material 610 is formed to fill the opening 605. In some embodiments, a barrier layer 606 may be conformally formed to cover the bottom and the sidewalls of the opening 605. The barrier layer 606 may include materials same as those described above; therefore, repeated descriptions of such details are omitted for brevity. In some embodiments, a liner 608 may be conformally formed in the opening 605. The liner 608 may include materials same as those described above; therefore, repeated descriptions of such details are omitted for brevity. The conductive material 610 is formed to fill the opening 605. The conductive material 610 may include materials same as those described above; therefore, repeated descriptions of such details are omitted for brevity.

Figure 11A:
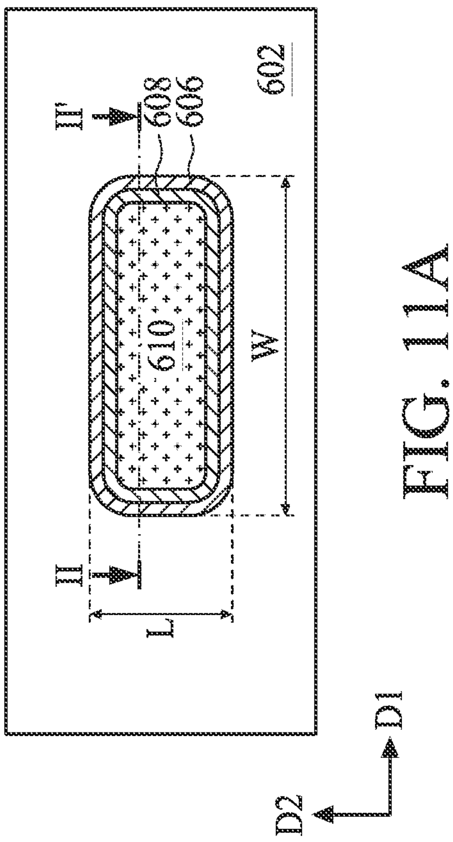
FIGS. 11A and 11B are schematic views of the connecting structure at a fabrication stage subsequent to that of FIGS. 10A and 10B.
Figure 11B:
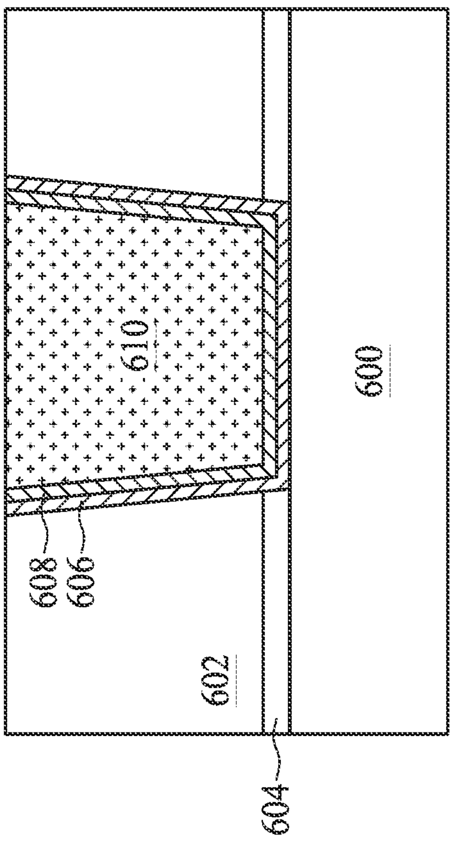

Referring to FIGS. 11A and 11B, a planarization, such as a chemical mechanical polishing (CMP) operation, is performed to remove superfluous conductive material 610, liner 608 and barrier layer 606. Accordingly, a top surface of the conductive material 610, a topmost portion of the liner 608, a topmost portion of the barrier layer 606 and a top surface of the dielectric layer 602 are aligned with each other.

Figure 12A:
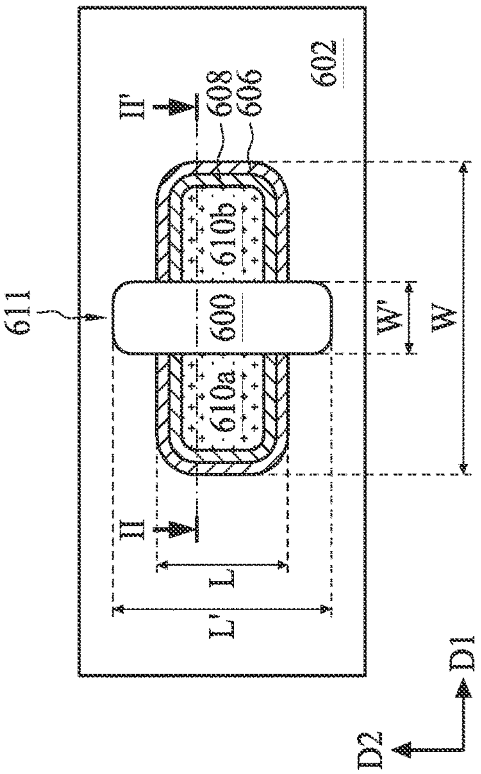
FIGS. 12A and 12B are schematic views of the connecting structure at a fabrication stage subsequent to that of FIGS. 11A and 11B.
Figure 12B:
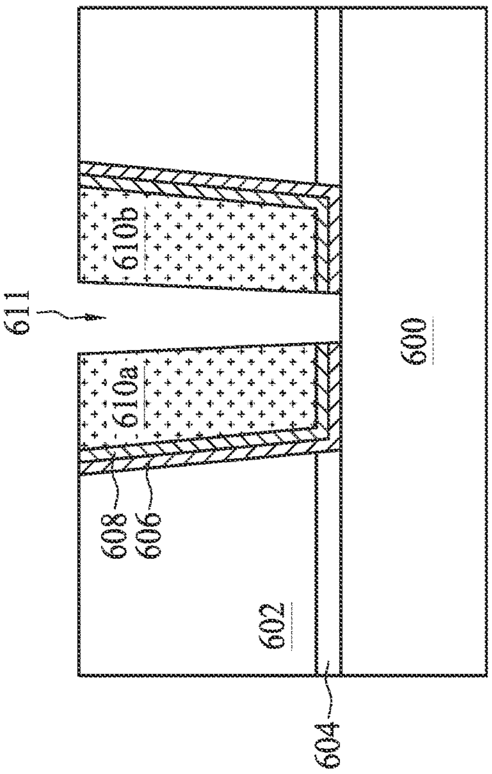

Referring to FIGS. 12A and 12B, in operation 508, an opening 611 is formed in the conductive material 610 and dividing the conductive material 610 to form a connecting via 610*a* and a connecting via 610*b*. As shown in FIG. 12A, the opening 611 has a width W' measured in the direction D1, and a length L' measured in the direction D2. The width W' of the opening 611 is less than the width W of the opening 605. Additionally, the width W' of the opening 611 is less than a width of the conductive material 610. The length L' of the opening 611 is greater than the length L of the opening 605. Further, the length L' of the opening 611 is greater than a length of the connecting via 610*a* and a length of the connecting via 610*b*. In operation 36, an isolation structure is formed. In some embodiments, the width W' of the opening 611 is between approximately 10 nanometers and approximately 300 nanometers, and the length L' of the opening 611 is between approximately 10 nanometers and approximately 1,000 nanometers, depending on different process approaches.

Still referring to FIGS. 12A and 12B, the opening 611 completely separates the connecting vias 610*a* and 610*b* from each other. Further, conductive features such as doped regions or conductive lines, as shown in FIGS. 4 and 5, are exposed through the bottom of the opening 611. In other embodiments, metallization lines, as shown in FIG. 6, are exposed through the bottom of the opening 611. Additionally, the barrier layer 606 and the liner 608 may be exposed through sidewalls of the opening 611.

Figure 13A:
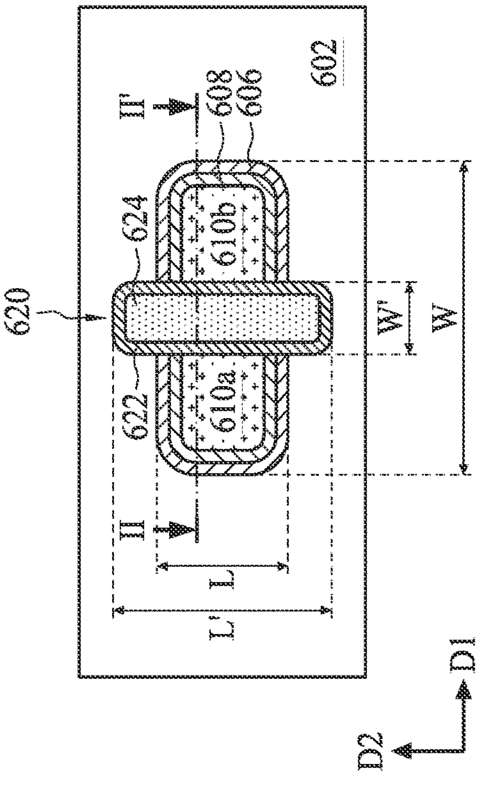
FIGS. 13A and 13B are schematic views of the connecting structure at a fabrication stage subsequent to that of FIGS. 12A and 12B.
Figure 13B:
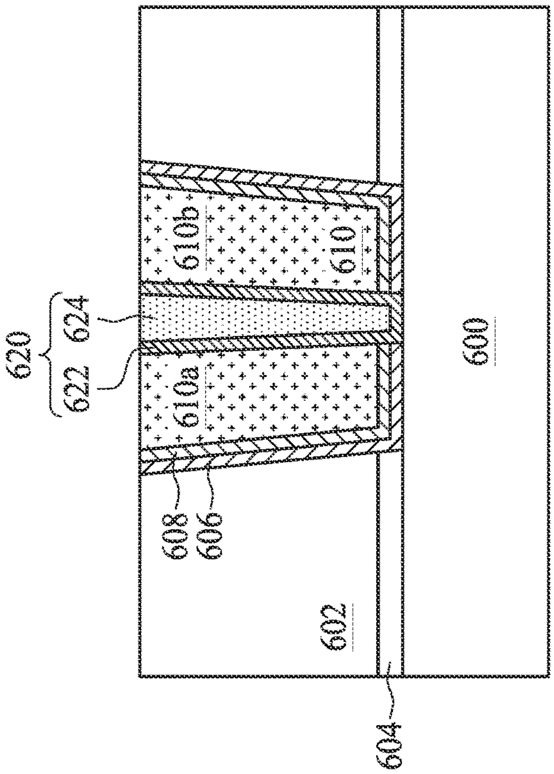

Referring to FIGS. 13A and 13B, in operation 508, an isolation 620 is formed in the opening 611. In some embodiments, the isolation 620 includes a dielectric material 624. In other embodiments, the isolation 620 may include a dielectric liner 622 and the dielectric material 624. In some embodiments, the dielectric liner 622 is conformally formed in the opening 611. The dielectric liner 622 cover a bottom and sidewalls of the opening 611. Materials used to form the dielectric liner 622 may be similar to those described above; therefore, repeated descriptions of such details are omitted for brevity. In such embodiments, the dielectric material 624 is formed over the dielectric liner 622 and fills the opening 611. Materials used to form the dielectric material 624 may be similar to those described above; therefore, repeated descriptions of such details are omitted for brevity.

A planarization (i.e., a CMP operation) is then performed to remove superfluous dielectric material 624 and dielectric liner 622, thereby forming the isolation 620, as shown in FIGS. 13A and 13B. In such embodiments, a top surface of the isolation 620, a top surface of the connecting via 610*a*, a top surface of the connecting via 610*b*, and the top surface of the dielectric layer 602 are aligned with each other. The isolation 620 physically separates the connecting vias 610*a* and 610*b* from each other. Further, the isolation 620 electrically isolates the connecting vias 610*a* and 610*b* from each other.

Figure 14:
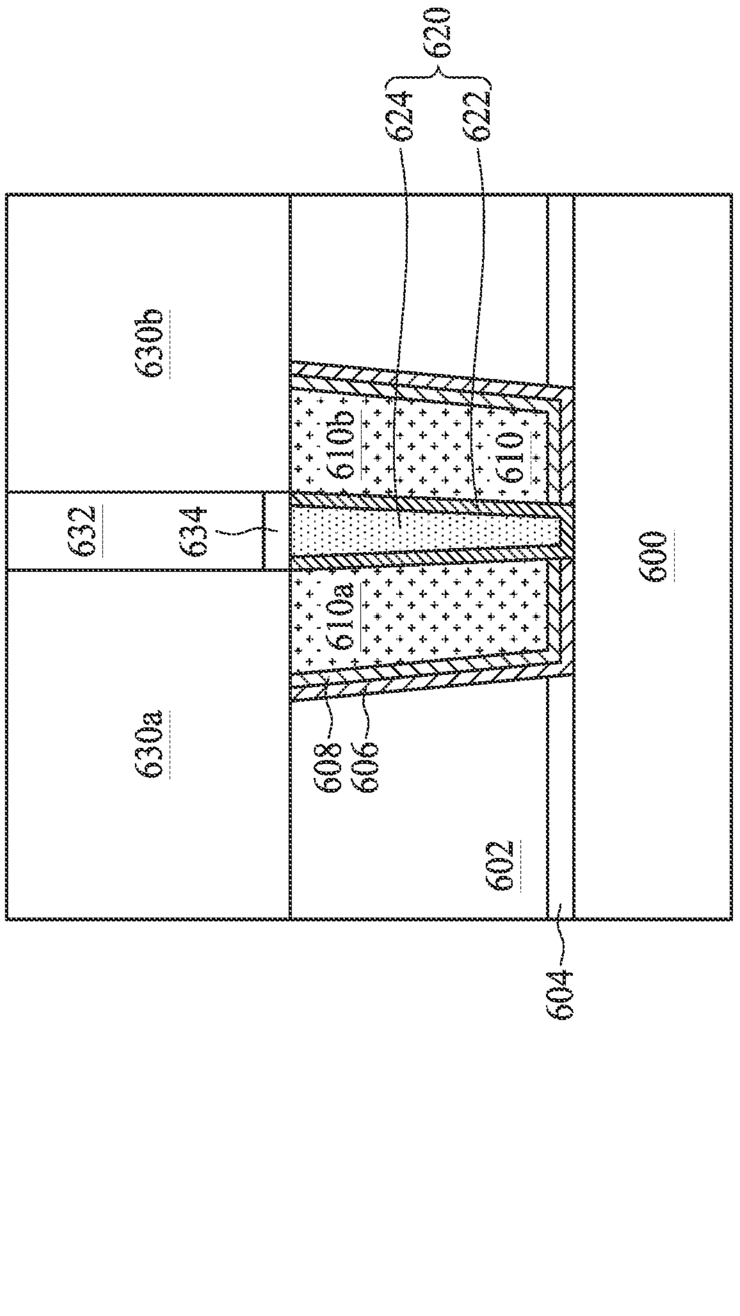
FIG. 14 is a schematic view of the connecting structure at a fabrication stage subsequent to that of FIG. 13B.

Referring to FIG. 14, in some embodiments, metallization lines 630*a* and 630*b* are formed over the dielectric layer 602. In some embodiments, another dielectric layer 632 is formed over the dielectric layer 602, the connecting vias 610*a* and 610*b*, and the isolation 620. In some embodiments, an etch stop layer 634 may be formed prior to the forming of the dielectric layer 632. Thus, the etch stop layer 634 is disposed between the dielectric layer 602 and the dielectric layer 632. In some embodiments, trenches are formed in the dielectric layer 632 and the etch stop layer 634. Thus, the connecting via 610*a* is exposed though a bottom of one of the trenches, and the connecting via 610*b* is exposed though a bottom of another trench. In some embodiments, metallization lines 630*a* and 630*b* are formed in the trenches. Thus, the metallization line 630*a* is coupled to the connecting via 610*a*, and the metallization line 630*b* is coupled to the connecting via 610*b*. As shown in FIG. 14, the dielectric layer 632 and the etch stop layer 634 are disposed between the metallization lines 630*a* and 630*b* and provide electrical isolation.

According to the method for forming the connecting structure, the isolation can be disposed in a pair of connecting vias in the FEOL, MEOL, BEOL and packaging processes, and thus the pair of connecting vias can provide different electrical paths. Further, an area occupied by the pair of connecting vias is less than one half that occupied by other vias, and thus density can be increased.

In summary, the present disclosure provides a connecting structure and a method for forming the same. In some embodiments, a volume of the connecting structure is less than one-half a volume of a connection structure in comparative approaches. Further, the method for forming the connecting structure can be integrated with FEOL, MEOL and BEOL processes, and even in the packaging process. Thus, the disclosed connecting structure and the method for forming the same provide an improved compatibility and flexibility in the semiconductor manufacturing.

In some embodiments, a connecting structure is provided. The connecting structure includes a first dielectric layer, a first connecting via in the first dielectric layer, a second connecting via in the first dielectric layer, and an isolation between the first connecting via and the second connecting via. The isolation separates the first and second connecting vias from each other. The first connecting via, the isolation and the second connecting via are line symmetrical about a central line perpendicular to a top surface of the first dielectric layer.

In some embodiments, a connecting structure is provided. The connecting structure includes a layer, a first connecting via in the layer, a second connecting via in the layer, and an isolation between the first and second connecting vias. The first and second connecting vias extend in a first direction, and the isolation extends in a second direction different from the first direction. The isolation separates the first and second connecting vias from each other. A width of the isolation is less than a width of the first connecting via measured in the first direction, and less than a width of the second connecting via measured in the first direction.

In some embodiments, a method for forming a connecting structure is provided. The method includes following operations. A dielectric layer is formed over a substrate. A first opening is formed in the dielectric layer. A conductive material is formed to fill the first opening. A top surface of the conductive material is aligned with a top surface of the dielectric layer. A second opening is formed in the conductive material. The second opening divides the conductive material into a first connecting via and a second connecting via. An isolation is formed in the second opening. The isolation separates the first and second connecting vias from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A connecting structure comprising:

a first dielectric layer;

a first connecting via in the first dielectric layer;

a first L-shaped barrier layer disposed between the first dielectric layer and the first connecting via and lining a bottom surface of the first connecting via;

a second connecting via in the first dielectric layer;

a second L-shaped barrier layer disposed between the first dielectric layer and the second connecting via and lining a bottom surface of the second connecting via;

an isolation between the first connecting via and the second connecting via and separating the first connecting via and the second connecting via from each other;

a first L-shaped liner disposed between the first L-shaped barrier layer and the first connecting via; and a second L-shaped liner disposed between the second L-shaped barrier layer and the second connecting via, wherein the first connecting via, the isolation and the second connecting via are line symmetrical about a central line or with different width perpendicular to a top surface of the first dielectric layer, wherein the first L-shaped liner and the second L-shaped liner are line symmetrical about the central line or having different configurations.

2. The connecting structure of claim 1, wherein the first L-shaped barrier layer and the second L-shaped barrier layer are line symmetrical about the central line or with different configurations.

3. The connecting structure of claim 1, further comprising a U-shaped liner between the isolation and the first connecting via, and between the isolation and the second connecting via.

4. The connecting structure of claim 1, further comprising:

a second dielectric layer over the first dielectric layer;

a first metallization line in the second dielectric layer and coupled to the first connecting via; and a second metallization line in the second dielectric layer and coupled to the second connecting via, wherein the first metallization line is separated from the second metallization line, and a distance between the first metallization line and the second metallization line is greater than a width of the isolation.

5. The connecting structure of claim 4, further comprising:

a third dielectric layer under the first dielectric layer;

a third metallization line in the third dielectric layer and coupled to the first connecting via; and a fourth metallization line in the third dielectric layer and coupled to the second connecting via, wherein the third metallization line is separated from the fourth metallization line, and a distance between the third metallization line and the fourth metallization line is greater than the width of the isolation.

6. The connecting structure of claim 4, further comprising:

a semiconductor substrate under the first dielectric layer;

a first conductive feature disposed in the semiconductor substrate and coupled to the first connecting via; and a second conductive feature disposed in the semiconductor substrate and coupled to the second connecting via, wherein the first conductive feature is separated from the second conductive feature, and a distance between the first conductive feature and the second conductive feature is greater than the width of the isolation.

7. The connecting structure of claim 6, further comprising a device disposed over the semiconductor substrate, wherein the first connecting via, the isolation and the second connecting via are separated from the device.

8. The connecting structure of claim 7, further comprising a third connecting via coupled to the device, and each of a width of first connecting via and a width of the second connecting via is less than a width of the third connecting via.

9. The connecting structure of claim 1, wherein a width of the isolation is less than a width of the first connecting via, and less than a width of the second connecting via.

10. The connecting structure of claim 1, wherein a top surface of the isolation, a top surface of the first connecting via and a top surface of the second connecting via are aligned with each other.

11. The connecting structure of claim 1, wherein a bottom surface of the isolation, the bottom surface of the first connecting via and the bottom surface of the second connecting via are aligned with each other.

12. A connecting structure comprising:

a layer;

a first connecting via in the layer extending in a first direction;

a second connecting via in the layer extending in the first direction;

an isolation between the first connecting via and the second connecting via and separating the first connecting via and the second connecting via from each other, and extending in a second direction different from the first direction;

a U-shaped liner between the isolation and the first connecting via, and between the isolation and the second connecting via;

a first L-shaped liner disposed between the layer and the first connecting via; and a second L-shaped liner disposed between the layer and the second connecting via, wherein a width of the isolation is less than a width of the first connecting via measured in the first direction, and less than a width of the second connecting via measured in the first direction, wherein the U-shaped liner is in contact with the layer from a plan view, and each of the first L-shaped liner and the second L-shaped liner is directly coupled to a bottom of the U-shaped liner.

13. The connecting structure of claim 12, wherein the layer comprises a dielectric material or a semiconductive material.

14. The connecting structure of claim 12, wherein a length of the isolation is greater than a length of the first connecting via measured in the second direction, and a length of the second connecting via measured in the second direction.

15. The connecting structure of claim 12, wherein each of the first L-shaped liner and the second L-shaped liner is in direct contact with the bottom of the U-shaped liner.

16. A method for forming a connecting structure, comprising:

forming a dielectric layer over a substrate;

forming a first opening in the dielectric layer;

forming a conductive material to fill the first opening, wherein a top surface of the conductive material is aligned with a top surface of the dielectric layer;

forming a second opening in the conductive material and dividing the conductive material to form a first connecting via and a second connecting via; and forming an isolation in the second opening, wherein the isolation separating the first connecting via and the second connecting via from each other.

17. The method of claim 16, further comprising forming a barrier layer and/or a liner in the first opening prior to the forming of the conductive material.

18. The method of claim 17, wherein the barrier layer and/or the liner are exposed through sidewalls of the second opening.

19. The method of claim 16, further comprising a forming a dielectric liner prior to the forming of the isolation.

20. The method of claim 16, further comprising a forming a first metallization line and a second metallization line over the dielectric layer, wherein the first metallization line is coupled to the first connecting via, the second metallization line is coupled to the second connecting via, and the first metallization line and the second metallization line are separated from each other.

* * * * *